(12) United States Patent
Kimijima et al.

(10) Patent No.: US 9,123,639 B2
(45) Date of Patent: Sep. 1, 2015

(54) POWER SEMICONDUCTOR MODULE

(71) Applicant: FUJI ELECTRIC CO., LTD., Kawasaki-shi (JP)

(72) Inventors: Daisuke Kimijima, Matsumoto (JP); Yuji Ichimura, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/512,372

(22) Filed: Oct. 10, 2014

(65) Prior Publication Data

US 2015/0115428 A1    Apr. 30, 2015

(30) Foreign Application Priority Data

Oct. 28, 2013    (JP) ................. 2013-222969

(51) Int. Cl.
*H01L 23/24* (2006.01)
*H01L 29/739* (2006.01)

(52) U.S. Cl.
CPC ............ *H01L 23/24* (2013.01); *H01L 29/7394* (2013.01)

(58) Field of Classification Search
CPC ..... H01L 23/24; H01L 23/3135; H01L 23/16; H01L 25/165
See application file for complete search history.

(56) References Cited

FOREIGN PATENT DOCUMENTS

| JP | S61-101056 A | 5/1986 |
| JP | H04-109550 U | 9/1992 |
| JP | H07-58282 A | 3/1995 |
| JP | 2005-057875 A | 3/2005 |

*Primary Examiner* — Roy Potter
(74) *Attorney, Agent, or Firm* — Rabin & Berdo, P.C.

(57) ABSTRACT

A power semiconductor module available under environments of high temperature has enhanced heat resistance of silicone gel filled up in a case. A power semiconductor module comprises a power semiconductor element, an insulating substrate mounted with the power semiconductor element, a resin case containing the power semiconductor element and the insulating substrate, a silicone gel injected into the resin case, and a sheet composed of a silicone rubber or silicone resin, disposed between the resin case and the silicone gel within the resin case.

11 Claims, 3 Drawing Sheets

POWER SEMICONDUCTOR MODULE

CROSS-REFERENCE TO RELATED APPLICATION

This application is based on, and claims priority to, Japanese Patent Application No. 2013-222969, filed on Oct. 28, 2013, contents of which are incorporated herein by reference.

BACKGROUND OF THE INVENTION

1. Field of the Invention

The present invention relates to a power semiconductor module, and more specifically a power semiconductor module where a silicone gel provides insulating protection of a surface of an insulating substrate mounted with semiconductor chips.

2. Description of the Related Art

In recent years, power semiconductor modules are widely used for power converters with Insulated Gate Bipolar Transistors (IGBTs) to main semiconductor elements. A power semiconductor module has a structure where a single or a plurality of power semiconductor chips are incorporated in a resin case, and constitutes a part or the whole of power conversion and connection.

In manufacturing power semiconductor modules generally, power semiconductor chips, such as IGBT chips or diode chips, are mounted on an insulating substrate composed of ceramic, and these power semiconductor chips and insulating substrate are housed within a resin case, and further the insulating substrate and a metal base are solder-bonded to each other. The power semiconductor chips are electrically insulated from the metal base. The resin case is bonded and fixed with an adhesive to a peripheral edge of the metal base, and a silicone gel of low elasticity is filled up within the resin case in order to insulate and protect the surface of the insulating substrate and the power semiconductor chips on the insulating substrate. The resin case is composed of thermo-plastics, such as Polyphenylenesulfide (PPS). A cover composed of the same resin as the resin case is set over the resin case.

The following are disclosed with respect to the structure of a power semiconductor module. Japanese Unexamined Utility Model Application Publication No. H4-109550 ("Patent Document 1") discloses a semiconductor device to cover semiconductor elements and wires with silicone gel, and further to fill silicone rubber foam between a power circuit board and a control circuit board. In addition, Japanese Unexamined Patent Application Publication No. H7-58282 ("Patent Document 2") discloses a power semiconductor module wherein a coating of a rubberlike synthetic resin is formed on the inner face of a bonding part of resin case to metal base. Further, Japanese Unexamined Patent Application Publication No. 2005-57875 ("Patent Document 3") discloses an inverter device with a diffusion preventive resin layer for preventing epoxy resin composition component transmission provided between an epoxy resin layer and a silicone gel layer sealing power semiconductor elements.

However, every structure of power semiconductor modules described in patent documents 1 to 3 insufficiently suppresses an influence of mutual reaction between silicone gel and component members forming the power semiconductor module, so that the suppression of silicone gel degradation can stand further improvement.

In recent years, an IGBT power semiconductor module has become required to perform continuous operation at high temperatures. A guarantee of continuous operation at high temperatures requires selection of one of accelerated life test conditions described in Table 3.1 of UL1557 for example, based on a guarantee temperature, to test the IGBT power semiconductor module under the selected condition, and then to enable maintenance of insulation breakdown resistance of the product standard as a pass criterion for the test.

Hardening degradation of silicone gel at high temperatures is cited as a degradation factor of insulation breakdown resistance in the test concerned. When hardening degradation of silicone gel makes progress, a crack of silicone gel is generated from a stress concentration spot in the inside of the IGBT power semiconductor module, and when the crack reaches the surface of the insulating substrate, preservation of insulation breakdown resistance becomes difficult.

In order to suppress the hardening degradation of silicone gel as mentioned above, there is a method of enhancing heat resistance of silicone gel by adding heat-resistant additives to silicone gel. However, even though silicone gel alone has sufficient heat resistance, at high temperatures of 200° C. or more, the hardening degradation is accelerated under the influence of component members of IGBT power semiconductor modules, and consequently inherent heat resistance of silicone gel alone may not be revealed. This phenomenon noticeably appears in silicone gel having a polydimethylsiloxane structure, most commonly known as a molecular structure of base polymer of silicone gel.

According to the above reason, even though evaluation of silicone gel alone results in sufficient heat resistance, in evaluating silicone gel applied to power semiconductor module products under UL1557, it may happen that insulation breakdown resistance cannot be preserved within the limits of the product standard after conducting the test under accelerated life test conditions.

One approach to a solution for this problem is to make a change into silicone gel, less influenced by mutual reaction with component members of power semiconductor modules (for example, of which the base polymer itself is provided with heat resistance by introducing high heat-resistant functional group into side chains of polydimethylsiloxane structure of the base polymer). By changing the base polymer, however, the property of the silicone gel greatly changes, and therefore it is possible that an unintended disadvantage happens where previously there was not a problem (for example, an increase of gel foam). In addition, the material cost of silicone gel very possibly increases, and further the time and cost required to research and develop new materials of silicone gel become necessary, and consequently the above-mentioned approach is not easily acceptable.

It is an object of the present invention to favorably solve the above-mentioned problems and to provide power semiconductor modules which allow the influence of mutual reaction between silicone gel and component members of power semiconductor modules to be suppressed and enable degradation of silicone gel to be suppressed thereby.

SUMMARY

In accordance with a first aspect of the present invention, a power semiconductor module includes a power semiconductor element, an insulating substrate mounted with the power semiconductor element, a resin case containing the power semiconductor element and the insulating substrate, a silicone gel injected into the resin case, and a sheet composed of silicone rubber or silicone resin, disposed between the resin case and the silicone gel within the resin case.

In accordance with the power semiconductor module of the first aspect of the present invention, the sheet composed of silicone rubber or silicone resin is disposed between the resin case and the silicone gel within the resin case, and therefore this sheet suppresses mutual reaction between silicone gel and low molecular decomposition products generated from resin composition of resin case and consequently hardening degradation of silicone gel, and further can guarantee continuous operation at high temperatures of the power semiconductor module.

DETAILED DESCRIPTION

Some embodiments of power semiconductor module of the invention will be described specifically with reference to the accompanying drawings below.

Figure 1:
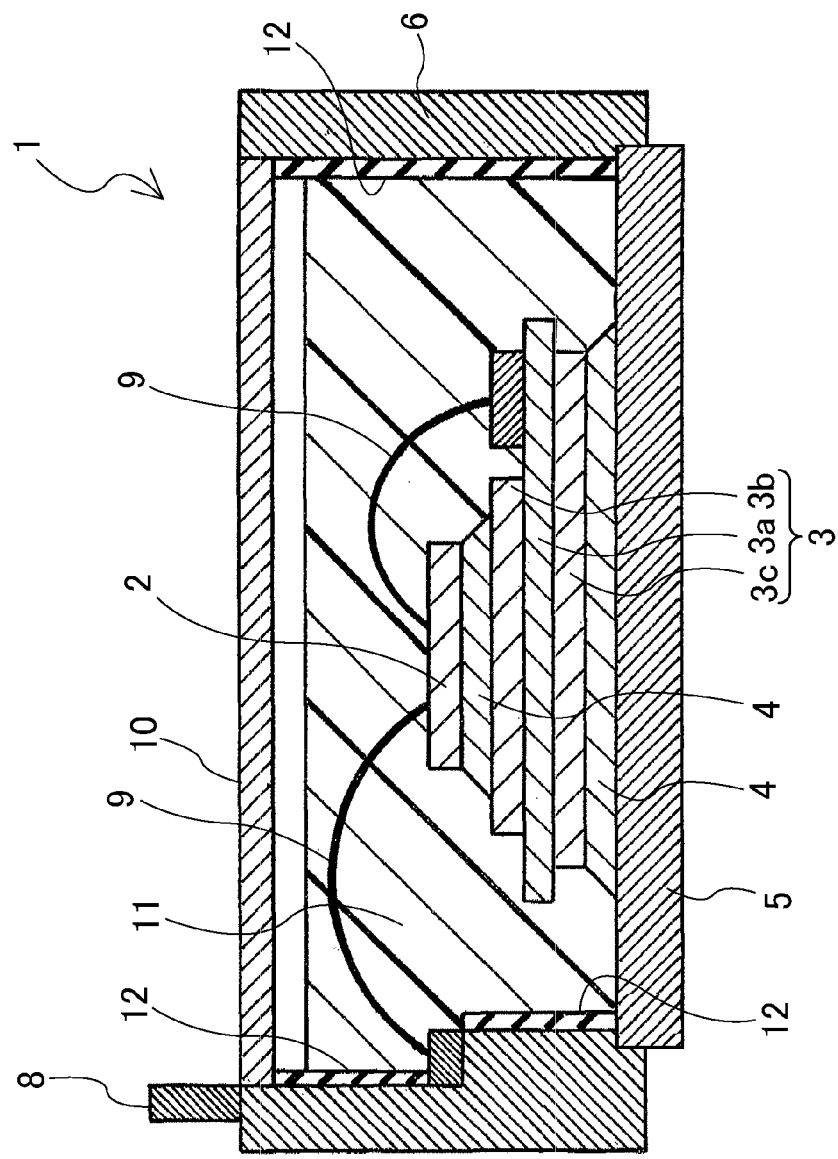
FIG. 1 is a schematic sectional view according to an embodiment of the power semiconductor module of the invention.

FIG. 1 shows a schematic sectional view according to an embodiment of a power semiconductor module of the invention. Power semiconductor module 1 of FIG. 1 is an IGBT power semiconductor module where IGBT chip 2 is used as an example of a power semiconductor element. But the power semiconductor element is not limited to the IGBT chip 2 in the power semiconductor module of the invention. Other power semiconductor chips can also be used such as diode chips or power MOSFET chips.

The IGBT chip 2 is mounted on insulating substrate 3. The embodiment shown in FIG. 1 illustrates one IGBT chip 2 as the power semiconductor element, but two or more IGBT chips 2 can also be constituted to be mounted on the insulating substrate 3. In addition, semiconductor elements other than the IGBT chip 2, for example a FWD (Free Wheeling Diode) chip, can also be constituted to be mounted on the insulating substrate 3 with the IGBT chip 2.

The insulating substrate 3 includes insulating layer 3a composed of ceramic, conductive layer 3b laminated on one surface of the insulating layer 3a and formed with a circuit pattern composed of copper foil or the like, and conductive layer 3c laminated on the other surface of the insulating layer 3a and composed of copper foil or the like. The insulating layer 3a can use ceramic material such as silicon nitride, alumina, and aluminum nitride.

The IGBT chip 2 is joined to the conductive layer 3b of the insulating substrate 3 with solder 4. In addition, metal base 5 is provided opposite the conductive layer 3c of the insulating substrate 3, and joined to this conductive layer 3c of the insulating substrate 3 with the solder 4. Resin case 6 is fixed to a peripheral edge of the metal base 5 by adhesives (not shown in the figure).

The IGBT chip 2 and the insulating substrate 3 are contained in a space surrounded by the resin case 6 above the metal base 5. The resin case 6 is composed of thermoplastic resin such as polyphenylenesulfide (PPS). The resin case 6 illustrated is combined with external lead-out terminal 8 in a single assembly through insert molding. This external lead-out terminal 8 and electrode of the IGBT chip 2 are electrically connected to each other through metal wire 9. Further, the other electrode of the IGBT chip 2 and the conductive layer 3b with the circuit pattern formed on the insulating substrate 3 are electrically connected to each other through metal wire 9.

Cover 10 is provided at the upper end of the resin case 6, which enables the inside of the resin case 6 to be hermetically sealed. The cover 10 is composed of the same resin material as the resin case 6. Silicone gel 11 is injected into this resin case 6 so as to cover the IGBT chip 2 and the insulating substrate 3. The silicone gel 11 is used for insulating and protecting the surface of insulating substrate 3 contained within resin case 6 and the IGBT chip 2 mounted on insulating substrate 3.

Sheet 12 composed of silicone rubber or silicone resin is provided between the side face of the resin case 6 and the silicone gel 11 within the resin case 6.

The inventors have seriously investigated the cause of hardening degradation of silicone gel 11, so that they have found out that the resin material used for resin case 6 has an influence on hardening degradation of silicone gel 11 among the component members of power semiconductor module 1. In addition, the investigation has proved that by being exposed under high temperatures of 200° C. or higher in conventional power semiconductor module, R—O. (radical group) of low molecular decomposition product generated of resin material used for resin case 6 becomes an accelerated degradation ingredient, pulls out hydrogen of a dimethyl group of a base polymer on silicone gel 11 to generate —CH2. (radical group), induces crosslinking by bonding —CH2. (radical group) together, and accelerates hardening degradation of silicone gel 11.

Accordingly, one approach to suppressing hardening degradation of silicone gel 11 is conceived to suppress generation of low molecular decomposition products mentioned above after assembly by means of heating resin case 6 before assembly (preheating). However, this approach to preheating is effective against hardening degradation of silicone gel 11, while inducing degradation of the resin material itself of resin case 6 (for example, degradation for mechanical strength or insulation resistance). In addition, when a temperature at preheating does not exceed a temperature of an accelerated life test of the power semiconductor module, generation of low molecular decomposition products cannot be suppressed at the accelerated life test, and therefore such temperature condition is undesirable to be applied.

Power semiconductor module 1 of the embodiment has a sheet 12 composed of silicone rubber or silicone resin between the silicone gel 11 and the side face of the resin case 6 within the resin case 6. By having sheet 12, the power semiconductor module can have a construction of suppressing generation of oxygen radical emitted from resin materials making up resin case 6 into the resin case 6.

The sheet 12 is provided at the side face of resin case 6 so that silicone gel 11 does not directly come in contact with the side face of resin case 6 within the resin case 6. The sheet 12 is put between resin case 6 and silicone gel 11 so as to prevent contact between the resin case 6 and silicone gel 11, which suppresses the mutual reaction of resin material of resin case 6 with silicone gel 11 and then the hardening degradation of silicone gel 11. Power semiconductor modules described in Patent Documents 1 to 3, to the contrary, do not have sheet 12 in the power semiconductor module 1 of the embodiment at the side face of the resin case within the resin case, and so oxygen radical is generated from resin material of the resin case, and consequently the resin material of resin case may mutually react with the silicone gel. Therefore, power semiconductor modules described in Patent Documents 1 to 3 insufficiently suppress the hardening degradation of silicone gel.

The sheet 12 is composed of silicone rubber or silicone resin, because silicone rubber or silicone resin has flexibility, high effectiveness on covering the inner side face of resin case 6, and difficulty in forming a gap between the sheet and the silicone gel touched thereby. Applying rigid resin such as epoxy resin to sheet 12 sometimes causes insulation resistance to be reduced by percolation of a cure agent included in resin into silicone gel and a gap to be formed between silicone gel 11 and sheet 12, and therefore such an application is not desirable.

Resin case 6 does not always have a flat surface because the side face formed with sheet 12 composed of silicone rubber or silicone resin has beams and terminal 8 formed by materials of resin case 6 if necessary. Accordingly, sheet 12 could be formed desirably by using addition curable type of silicone rubber (for example, TSE325 manufactured by Momentive Performance Materials Inc.), so as to adhere closely to the side face of resin case 6 having a complicated shape.

Silicone gel 11 preferably has a polydimethylsiloxane structure in a main skeleton base polymer, because silicone gel with polydimethylsiloxane structure in a main skeleton is generally used as silicone gel 11 which is injected and filled within resin case 6 of power semiconductor module 1.

Silicone gel 11 preferably has penetration of 20 to 120 (1/10 mm) after curing in accordance with JIS K2220. For penetration of less than 20, metal wire 9 becomes easy to be disconnected, and then reliability becomes difficult to be secured, only depending on material and diameter of metal wire 9. In addition, for penetration in excess of 120, cracks become easy to be generated because of poor shape stability and also reduced mechanical strength.

Sheet 12 composed of silicone rubber or silicone resin preferably has a thickness not less than 0.5 mm in order to faultlessly cover the whole surface of resin case 6 in contact with silicone gel 11. Further, sheet 12 composed of silicone rubber or silicone resin desirably has the upper limit to thickness in no contact with the edge of insulating substrate 3, IGBT chip 2, and metal wire 9 within resin case 6, so as not to interfere with the role of silicone gel 11 such as insulation resistance and stress relaxation of metal wire 9.

Sheet 12 composed of silicone rubber or silicone resin desirably has Hardness Shore A of not more than 38 in accordance with JIS K6253. The Hardness which falls in the above range enables the gap between sheet 12 and silicone gel 11 not to be generated.

The sheet 12 composed of silicone rubber or silicone resin is preferably formed close to the side face of the resin case 6, by either being stuck together on the side face of the resin case 6 or being applied to the side face of the resin case 6 and thereafter cured. Certainly, it is left out of consideration to exclude the other embodiments that resin case 6 and silicone gel 11 are in a non-contact state with each other.

Materials of sheet 12 composed of silicone rubber or silicone resin are not limited to materials shown in examples mentioned below. Any material publicly known can be used if it is possible to be stuck together on the inner side face of resin case 6 injected with silicone gel 11 or to be formed as a sheet by application and curing.

EXAMPLES OF EMBODIMENT

In examples and comparative example shown below, penetration was measured highly correlative to hardness of silicone gel in order to evaluate the degree of quantitative hardening degradation of the silicone gel under the accelerated degradation conditions while retaining power semiconductor modules at high temperatures. An index of measurement evaluation was defined as a half-value period of penetration: time required for the hardness changing to double. In addition, products of power semiconductor modules, because of difficulty of penetration measurement, measured penetration and then evaluated effectiveness by using samples shown in FIG. 2.

Figure 2:
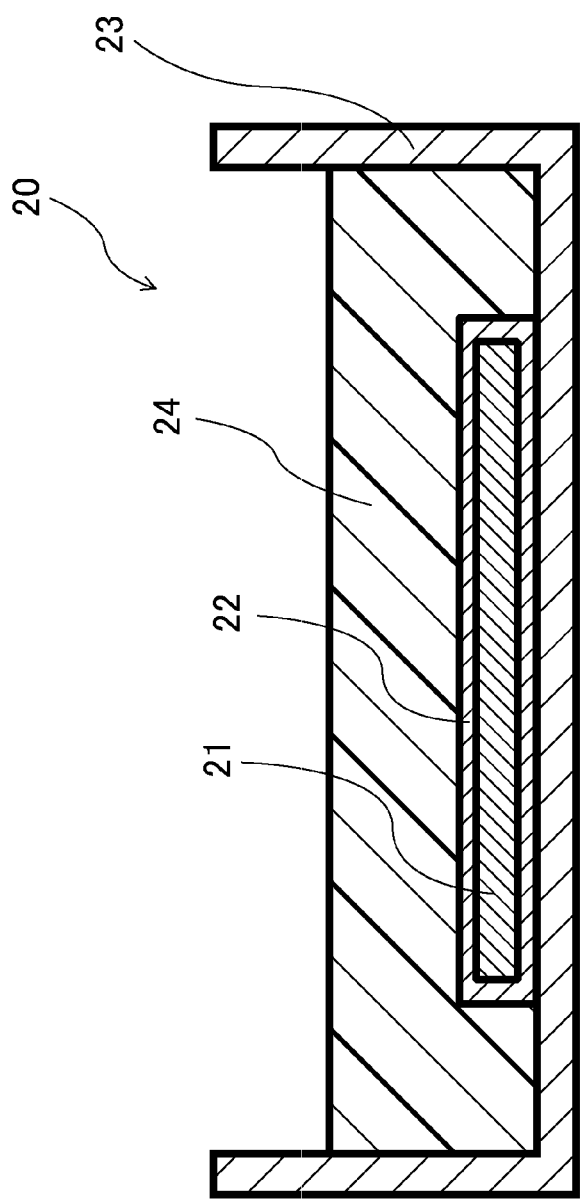
FIG. 2 is a schematic sectional view showing a measurement sample for penetration in every example.

FIG. 2 shows a sectional view of sample 20. In FIG. 2, sample 20 includes resin plate 21 composed of the same material as a resin case of a power semiconductor module (15 mm in long side, 10 mm in short side, and 5 mm in thickness), silicone rubber sheet 22 covering the whole surface of this resin plate 21, glass laboratory dish 23 (90 mm in inner diameter) containing this resin plate 21 and silicone rubber sheet 22, and silicone gel 24 injected into this glass laboratory dish 23.

The present examples used PPS resin A310M manufactured by Toray Corp. as material of resin plate 21, and applied to cure TSE325 (addition curable type silicone rubber) manufactured by Momentive Performance Materials Inc. in the whole surface of the resin plate 21 as material of silicone rubber sheet 22. At this time, by changing variously amount of application to a plurality of resin plates 21, a plurality of silicone rubber sheet 22 were prepared of which the thickness was variously changed. Every silicone rubber sheet 22 had Hardness Shore A of 12 in accordance with JIS K6253.

Resin plate 21 formed with silicone rubber sheet 22 on the surface was put in glass laboratory dish 23. TSE3051SK of 40 cm$^3$ (manufactured by Momentive Performance Materials Inc.) was filled within the glass laboratory dish 23 as silicone gel 24, provided with debubbling in vacuum for 3 min. with not more than 0.2 atmosphere, and cured by heating for 60 min. in a hot-air dryer of 100° C. to provide samples. Silicone gel 24 of the sample had penetration of 65 (1/10 mm) in accordance with JIS K2220.

Described in the following are type and thickness of silicone rubber sheet 22 to be formed on the whole surface of resin plate 21 in each example.

Example 1

A silicone rubber sheet having a thickness of 3.0 mm was formed by using TSE35 (addition curable type silicone rubber) manufactured by Momentive Performance Materials Inc.

Example 2

A silicone rubber sheet having a thickness of 1.5 mm was formed by using TSE35 (addition curable type silicone rubber) manufactured by Momentive Performance Materials Inc.

Example 3

A silicone rubber sheet having a thickness of 1.0 mm was formed by using TSE35 (addition curable type silicone rubber) manufactured by Momentive Performance Materials Inc.

Example 4

A silicone rubber sheet having a thickness of 0.5 mm was formed by using TSE35 (addition curable type silicone rubber) manufactured by Momentive Performance Materials Inc.

Example 5

A silicone rubber sheet having a thickness of 0.3 mm was formed by using TSE35 (addition curable type silicone rubber) manufactured by Momentive Performance Materials Inc.

Example 6

A silicone rubber sheet having a thickness of 0.1 mm was formed by using TSE35 (addition curable type silicone rubber) manufactured by Momentive Performance Materials Inc.

Comparative Example 1

No silicone rubber was applied and cured, that is, a silicone rubber sheet had a thickness of 0 mm.

Samples in examples and the comparative example were left in a hot-air dryer of 200° C. Each sample was taken out at predetermined times, and after cooling down to room temperature, penetration measurement was performed and then aging of penetration was investigated.

In Table 1, the evaluation results are shown about example 1 to 6 and comparative example 1. In Table 1, penetration is also shown for silicone gel alone as reference. As shown in Table 1, examples 1 to 6 with silicone rubber sheet 22 have a longer half-value period of penetration as compared with comparative example 1 without silicone rubber sheet 22, which indicates that silicone rubber sheet 22 suppresses hardening degradation of silicone gel 24.

TABLE 1

|  | resin plate | silicone rubber sheet thickness (mm) | 200° C. penetration half-value period (h) |
| --- | --- | --- | --- |
| Reference | absence | — | ≧1000 |
| Example 1 | presence | 3.0 | ≧1000 |
| Example 2 | presence | 1.5 | ≧1000 |
| Example 3 | presence | 1.0 | ≧1000 |
| Example 4 | presence | 0.5 | ≧1000 |
| Example 5 | presence | 0.3 | 700 |
| Example 6 | presence | 0.1 | 630 |
| Comparative Example 1 | presence | 0.0 | 620 |

Example 5 and example 6 with silicone rubber sheet 22 of not more than 0.3 mm in thickness only have a little longer half-value period of penetration as compared with comparative example 1. When silicone rubber sheet 22 is not more than 0.3 mm in thickness, the whole surface of resin plate 21 is difficult to cover with no failure, and therefore it is probable that intended effectiveness was small.

Examples 1 to 4 with silicone rubber sheet 22 of 0.5 to 3 mm in thickness have a half-value period of penetration nearly equal to silicone gel alone; as a result, it was confirmed that accelerated hardening degradation of silicone gel can be suppressed.

Figure 3:
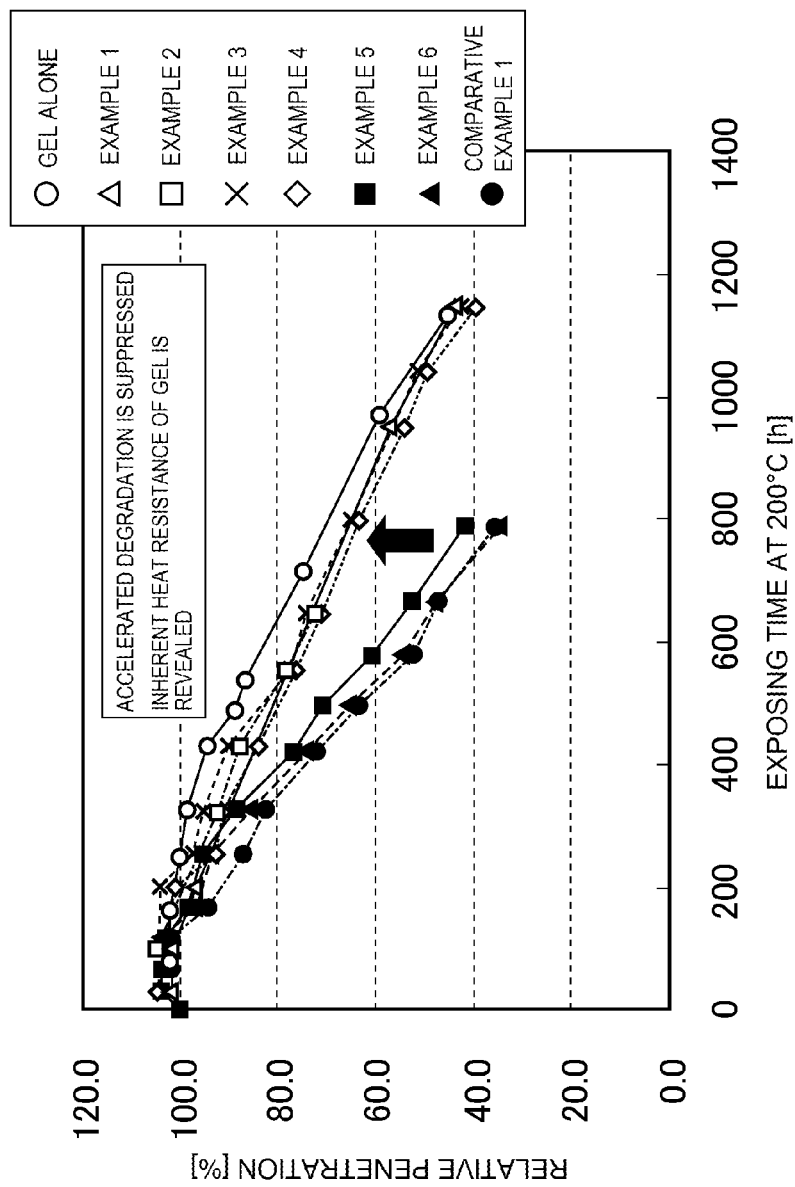
FIG. 3 is a graph showing a relative penetration relationship for aging/exposing time at 200° C. for samples of a plurality of examples respectively.

FIG. 3 is a graph showing relative penetration relationships for aging/exposing time at 200° C. for samples of each example and the comparative example respectively. It is indicated that each example has less reduction in relative penetration for aging time as compared with the comparative example, and then less hardening degradation. In particular, examples 1 to 4 with silicone rubber sheet 22 of 0.5 to 3 mm in thickness have less reduction in relative penetration for aging/exposing time as compared with examples 5 and 6, too.

It will be apparent to one skilled in the art that the manner of making and using the claimed invention has been adequately disclosed in the above-written description of the exemplary embodiments taken together with the drawings. Furthermore, the foregoing description of the embodiments according to the invention is provided for illustration only, and not for limiting the invention as defined by the appended claims and their equivalents.

It will be understood that the above description of the exemplary embodiments of the invention are susceptible to various modifications, changes and adaptations, and the same are intended to be comprehended within the meaning and range of equivalents of the appended claims.

EXPLANATION OF REFERENCE NUMERALS

1 power semiconductor module
2 IGBT chip
3 insulating substrate
4 solder
5 metal base
6 resin case
8 external lead-out terminal
9 metal wire
10 cover
11 silicone gel
12 sheet

What is claimed is:

1. A power semiconductor module comprising:
  a power semiconductor element;
  an insulating substrate mounted with the semiconductor element;
  a resin case containing the power semiconductor element and the insulating substrate;
  a silicone gel injected into the resin case; and
  a sheet composed of a silicone rubber or a silicone resin, disposed between the resin case and the silicone gel.

2. The power semiconductor module according to claim 1, wherein the silicone gel has a penetration of 20 to 120 (1/10 mm) after curing in accordance with JIS K2220, with a polydimethylsiloxane structure in a main skeleton base polymer.

3. The power semiconductor module according to claim 1, wherein the sheet composed of the silicone rubber or the silicone resin has a JIS A hardness of not more than 38.

4. The power semiconductor module according to claim 1, wherein the sheet composed of the silicone rubber or the silicone resin has a thickness of not less than 0.5 mm.

5. The power semiconductor module according to claim 1, wherein the sheet composed of the silicone rubber or the silicone resin is formed on an inner side face of the resin case.

6. The power semiconductor module according to claim 2, wherein the sheet composed of the silicone rubber or the silicone resin has a JIS A hardness of not more than 38.

7. A semiconductor device, comprising:
  a case to house a semiconductor element;
  a silicone gel within the case; and
  a contact prevention layer between a wall of the case and the silicone gel;
  wherein the case includes a resin and the contact prevention layer includes a flexible material.

8. The semiconductor device of claim 7, wherein the flexible material includes a silicone rubber or a silicone resin.

9. The semiconductor device of claim 7, wherein the flexible material is curable.

10. The semiconductor device of claim 7, wherein the contact prevention layer has a thickness of at least 0.5 mm.

11. A semiconductor device, comprising:
  a case to house a semiconductor element;
  a silicone gel within the case; and a contact prevention layer between a wall of the case and the silicone gel;

wherein the contact prevention layer has a thickness of at least 0.5 mm.

* * * * *